United States Patent
Gupta et al.

(10) Patent No.: US 7,453,319 B2
(45) Date of Patent: Nov. 18, 2008

(54) MULTI-PATH COMMON MODE FEEDBACK FOR HIGH SPEED MULTI-STAGE AMPLIFIERS

(75) Inventors: Amit Kumar Gupta, Dallas, TX (US); Vijayakumar Dhanasekaran, Bryan, TX (US); Karthikeyan Soundarapandian, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 66 days.

(21) Appl. No.: 11/461,758

(22) Filed: Aug. 1, 2006

(65) Prior Publication Data

US 2007/0188231 A1    Aug. 16, 2007

Related U.S. Application Data

(60) Provisional application No. 60/772,617, filed on Feb. 13, 2006.

(51) Int. Cl.
*H03F 3/45* (2006.01)
(52) U.S. Cl. .................. 330/258; 330/253
(58) Field of Classification Search ............ 330/253, 330/258, 260, 261
See application file for complete search history.

(56) References Cited

U.S. PATENT DOCUMENTS

| | | | | |
|---|---|---|---|---|
| 4,825,173 A | * | 4/1989 | Cornett | 330/252 |
| 6,388,522 B1 | * | 5/2002 | Fattaruso et al. | 330/258 |
| 6,617,921 B2 | * | 9/2003 | Forejt | 330/253 |
| 6,774,722 B2 | * | 8/2004 | Hogervorst | 330/258 |

OTHER PUBLICATIONS

A.K. Gupta et al., Multipath common-mode feedback scheme suitable for high-frequency two-stage amplifiers, IEEE Electronics Letters, Apr. 27th, 2006, vol. 42 No. 9.

* cited by examiner

*Primary Examiner*—Henry K Choe
(74) *Attorney, Agent, or Firm*—Warren L. Franz; Wade J. Brady, III; Frederick J. Telecky, Jr.

(57) ABSTRACT

The invention includes methods and systems for providing a multi-path common mode feedback loop in an amplifier system. Embodiments include techniques for dividing a common mode feedback current path to provide a slow common mode feedback current path and a fast common mode feedback current path. The slow and fast paths are configured for controlling common mode feedback current within a small bandwidth.

13 Claims, 2 Drawing Sheets

MULTI-PATH COMMON MODE FEEDBACK FOR HIGH SPEED MULTI-STAGE AMPLIFIERS

PRIORITY ENTITLEMENT

This application claims priority based on Provisional Patent Application Ser. No. 60/772,617 filed on Feb. 13, 2006. This application and the aforementioned Provisional Patent Application have one or more common inventors and are assigned to the same entity.

TECHNICAL FIELD

The invention relates to electronic semiconductor devices and manufacturing. More particularly, the invention relates to systems and methods for common mode feedback loops for use with amplifier systems having an even number of gain stages.

BACKGROUND OF THE INVENTION

Fully differential amplifiers are widely used in modern integrated circuits in view of their relatively large output swings and relatively low susceptibility to common mode (CM) noise. One significant disadvantage of these circuits is the need for a common mode feedback (CMFB) circuit to control the CM output voltage. The main purpose of the CMFB circuit is to sense the output CM voltage and use negative feedback to force it equal to the desired common mode, or reference voltage (VREF). In some instances, however, the CMFB loop is ineffective due to large positive feedback produced by the external network overwhelming the negative feedback loop, leading to the output staying at the rails, a condition known as "latching". Conventional solutions require a large bandwidth CMFB loop in order to avoid latching states, causing practical problems in implementing high-speed circuits.

An example representative of methods known in the arts for detection and feedback of the common mode correction signal applicable to a two-stage amplifier system is shown in FIG. 1 (prior art). A two stage Miller compensated amplifier is depicted with a traditional resistor averaged CMFB arrangement. Examination of the circuit reveals that only a fraction of the total current is controlled by the common mode loop, i.e., (I3/(I3+I4)). The DC error in the common mode output may be described by the equation:

$$\Delta V_{OCM} = V_{REF} - V_{OCM} = \Delta I/(g_{m3} * A_1) \qquad \text{[Equation 1]},$$

where $\Delta I$ is the open-loop mismatch between the current sources $(I_{10}+I_{20}-I_{30}-I_{40})$, and $A_1$ is the voltage gain of the common mode sense amplifier shown in broken lines in FIG. 1 (prior art). Thus, it may be observed that the error may be reduced by increasing the transconductance gain, $(g_{m3}*A_1)$ For a two stage amplifier, although the feedback through the external network is negative for the differential signals, it is positive for the common mode signals. In normal operating conditions, the negative feedback loop gain is much larger compared to the positive feedback loop gain, so the latter is not of much concern. The primary problem occurs during startup or during large common mode transients, in which cases the input differential pair turns off. This may result in the output swinging to the rails and latching there. Many operational amplifier systems have no built-in provision to avoid these latching states. For the design shown in FIG. 1 (prior art), a latching state occurs either when, $I_4 > I_2$, or when, $I_3 < I_1$. Thus, to avoid these latching states, the CMFB loop should at least control $I_1$. It should be appreciated by those skilled in the arts that the problem of latching can exist even if the CMFB is applied to transistor M2 instead of M3, or in the case of an NMOS input stage instead of a PMOS input stage.

When addressing these and other problems with techniques known in the arts, it is generally more difficult to compensate the CMFB loop compared to the differential loop because of two additional poles in the former. Assuming removal of right hand plane (RHP) zero due to Miller compensation by the nulling resistor Rz, and continuing to refer to FIG. 1 (prior art), the common mode loop gain is described by the equation:

$$A_{CM}(s) = [A_{01} + s/\omega_z)]/[(1+s/\omega_d)(1+s/\omega_L)(1+s/\omega_f)(1+s/\omega_{cm1})(1+s/\omega_{cm2})] \qquad \text{[Equation 2], where,}$$

$$A_0 = (g_{m3}g_{m5}g_{m6}g_{m8})/[(g_{m6}g_{ds5}(g_{ds4}+g_{ds3}) + g_{m5}g_{ds2}g_{ds6})(g_{ds11}+g_{ds8})*2g_{m7}/g_{m9}],$$

$$\omega_d \approx A_1 g_{m3}/A_0 C_C,$$

$$A_1 \approx g_{m7}/2g_{m9},$$

$$\omega_f = g_{m5}/(C_{sb5}+C_{db1}+C_{gd1}+C_{db3}+C_{db4}),$$

$$\omega_{cm1} = 4/R_1(4C_1+C_{gs7}),$$

$$\omega_{cm2} = g_{m9}/(C_{gs9}+C_{db9}+C_{gs3}),$$

$$\omega_L \approx g_{m8}/C_L, \omega_z = 1/R_1 C_1.$$

For $C_{gs7} << 4C_1$, $\omega_{cm1} \approx \omega_z$, therefore Equation 2 may be expressed in the simplified form:

$$A_{CM} = A_0/[(1+s/\omega_d)(1+s/\omega_L)(1+s/\omega_f)(1+s/\omega_{cm2})], \qquad \text{[Equation 3]}.$$

For the example of FIG. 1 (prior art), the differential loop bandwidth may be described by, $\beta_{gm1}/C_C$, and the common mode loop bandwidth by, $A_1 g_{m3}/C_C$. The capacitor $C_C$ is generally selected for optimal compensation of the differential loop. Since the feedback factor ($\beta$) does not affect the common mode loop bandwidth, for a design with small feedback factor, it is possible for the common mode loop bandwidth to exceed the differential loop bandwidth, $A_1 g_{m3}/C_C > \beta_{gm1}/C_C$, leading to problems with common mode instability. The solution widely used in the arts is to reduce the fraction of current controlled by the CMFB, i.e., to reduce $I_3$, and thereby reduce $g_{m3}$. This approach, however, leads to increased DC common mode error, as expressed in Equation 1. Additionally, if $I_3$ is less than $I_1$, latching remains a problem.

In two stage amplifier systems these and other problems beset efforts to control larger current in common mode loops and to avoid latching. There is a need for improved methods and systems for stabilizing the common mode feedback (CMFB) loop, while avoiding latching states, particularly in high speed fully differential two stage amplifier systems.

SUMMARY OF THE INVENTION

In carrying out the principles of the present invention in accordance with preferred embodiments thereof, methods and systems using a multi-path common mode feedback loop may be used to control a large current while at the same time maintaining a low bandwidth.

According to one aspect of the invention, a system for common mode feedback in a fully differential two stage amplifier system is provided. In an example of a preferred embodiment, a multi-path common mode feedback loop of the system is configured for smaller bandwidth and large bias current.

According to another aspect of the invention, a system for CMFB in an amplifier system includes, in a multi-path CMFB loop, a slow path having a low pass filter configured to ensure that the slow path is inactive at approximately the unity gain bandwidth of the system.

According to yet another aspect of the invention, a system for a multi-path CMFB loop in a fully differential two stage amplifier system is provided. In one embodiment, the bandwidth of the multi-path common mode feedback loop is described by the ratio of the transconductance gain of a fast path of the multi-path CMFB loop and the compensating capacitance of the fully differentiated two stage amplifier system.

According to still another aspect of the invention, a method for controlling a common mode feedback loop for a two stage amplifier system includes steps for dividing the common mode feedback current path to provide a slow common mode feedback current path and a fast common mode feedback current path. The slow and fast paths are configured to work in concert for controlling common mode feedback current within a smaller bandwidth.

According to another aspect of the invention, a method for controlling a multi-path common mode feedback loop for a two stage amplifier system includes determining the bandwidth of the multi-path common mode feedback loop by the ratio of the transconductance gain of a fast path of the CMFB loop and the compensating capacitance of the two stage amplifier system.

The invention has advantages including but not limited to one or more of the following: providing large transconductance gain at low frequencies in a CMFB loop; providing low transconductance gain at high frequencies in a CMFB loop; stabilizing the common-mode feedback (CMFB) loop in high speed fully differential two-stage amplifiers; avoiding the occurrence of latching in amplifier systems. These and other features, advantages, and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

References in the detailed description correspond to like references in the various drawings unless otherwise noted. Descriptive and directional terms used in the written description such as top, bottom, upper, side, etc., refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DESCRIPTION OF PREFERRED EMBODIMENTS

In general, the invention provides multi-path common mode feedback (CMFB) methods and systems having large transconductance gain at low frequencies, and also having a low transconductance gain at high frequencies in the CMFB loop. The multi-path techniques of the invention avoid the occurrence of latching states and maintain increased stability in the CMFB loop.

Figure 1:
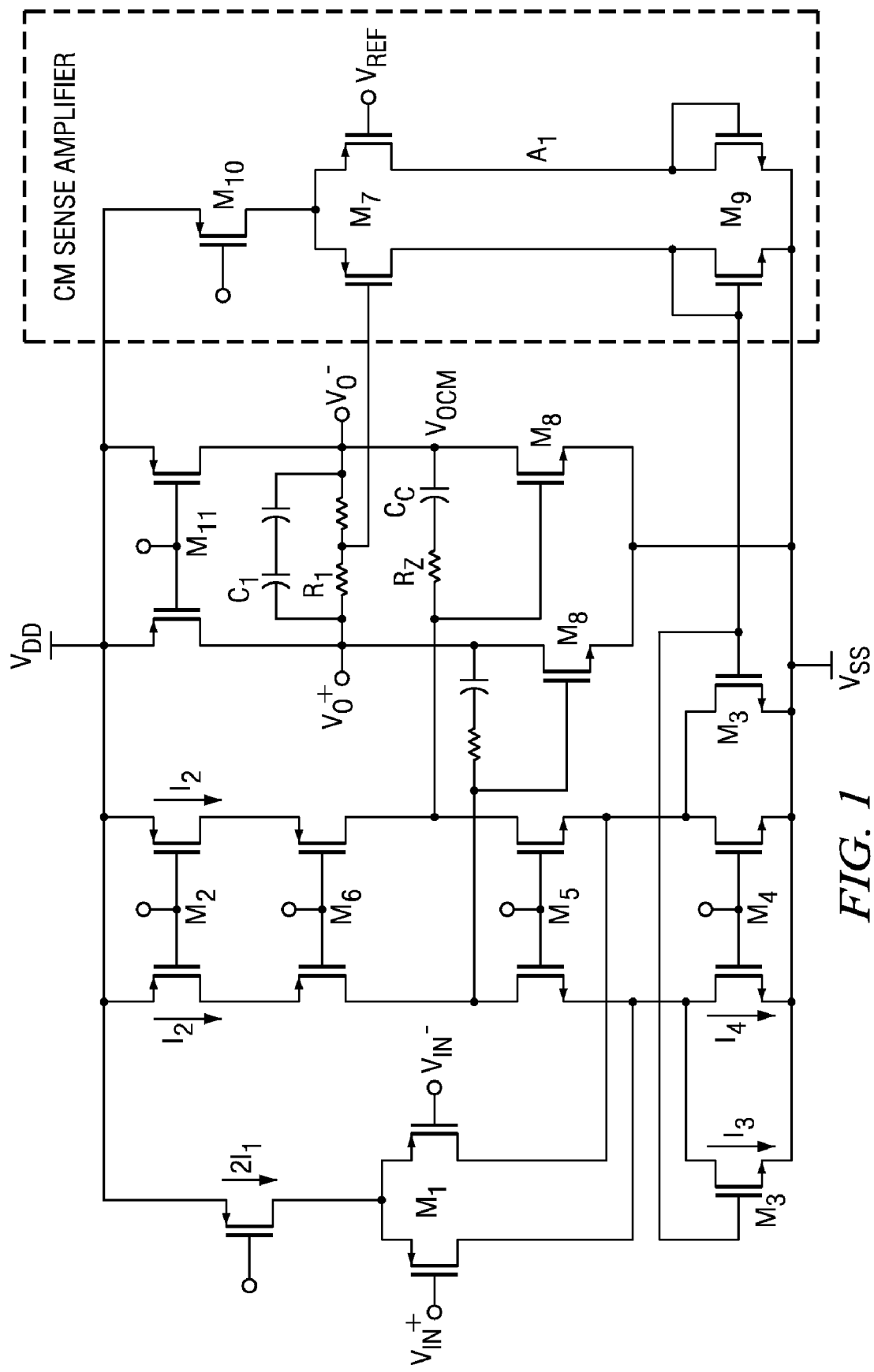
FIG. 1 (prior art) is a schematic diagram representative of a circuit known in the arts for providing common mode feedback in a two stage amplifier system.
Figure 2:
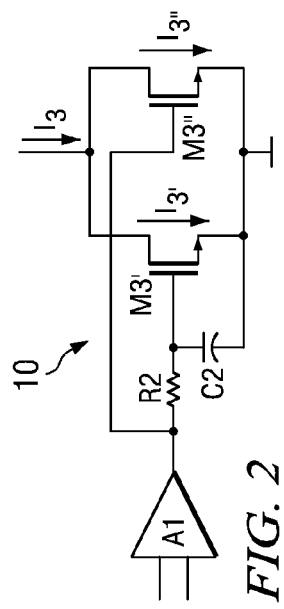
FIG. 2 is a simplified schematic diagram illustrating examples of methods and systems having a multi-path common mode feedback loop according to preferred embodiments of the invention.
Figure 3:
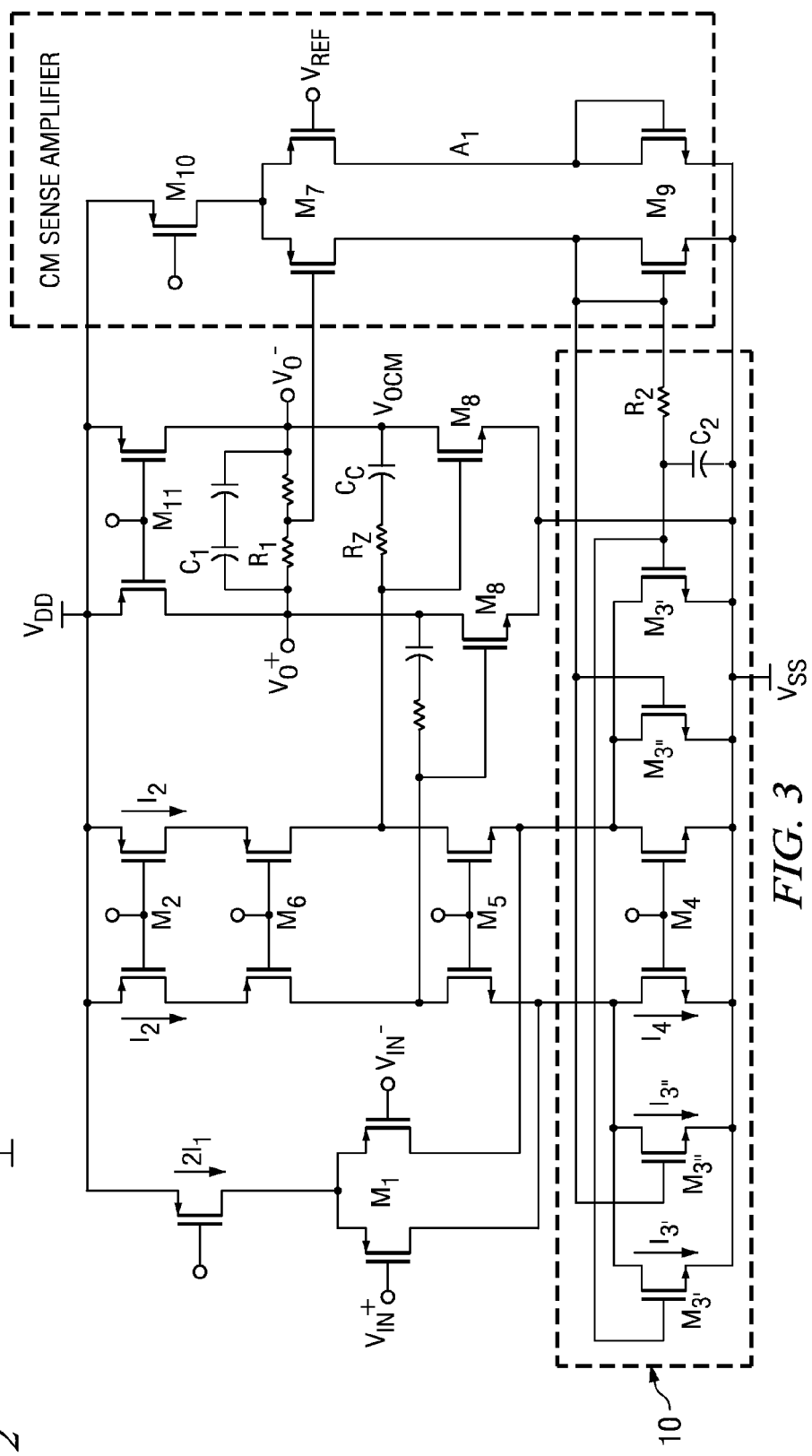
FIG. 3 is a schematic diagram of an example of a system embodying a preferred method of implementing a multi-path common mode feedback loop in an amplifier system according to the principles of invention.

Referring to FIG. 2, a circuit method and system having a multi-path common mode loop according to the principles of the invention is shown in a simplified block diagram. Those skilled in the arts will appreciate that there are two contradictory aspects desirable for implementation of common mode feedback systems for high-speed two-stage amplifiers: for stability, it is desirable to have small bandwidth; for avoiding latching states, it is desirable to have large bias currents. As circuit illustrated in FIG. 2, the invention provides two distinct paths in the common mode feedback loop 10, herein denominated the "slow path" through transistor M3', and a "fast path" through transistor M3". In operation, the multi-path combination of the slow path and fast path determines the DC performance of the common mode feedback loop 10, while the fast path M3" alone determines the bandwidth of the CMFB loop 10. The slow path preferably has a low pass filter, such as a series RC filter, (R2, C2) in the CMFB loop 10. Preferably, the 3 dB bandwidth of this low pass filter R2C2 is set to about one-tenth of the fast path bandwidth, which ensures that the slow path is not active near unity gain bandwidth (UGB) of the loop. The bandwidth of the loop is determined by how the current $I_3$ is split between the fast path $I_3"$ and the slow path $I_3'$.

An example illustrating the use of a preferred embodiment of a CMFB loop 10 of the invention with a multi-stage amplifier system is shown. The CMFB loop 10 incorporates the multi-path loop shown and described with reference to FIG. 2, dividing the current $I_3$ is between the fast path $I_3"$ and the slow path $I_3'$.

For reference, defining $I_3"=kI_3$ and $I_3'=(1-k)I_3$, assuming that $\omega_{cm1} \approx \omega_z$, as in Equation 3, the loop gain may be described by the expression:

$$A_{CM}(s)=[kA_0(1/k+s/\omega_{ps})g_{m9}]/[(1+s/\omega_d)(1+s/\omega_L)(1+s/\omega_f)*(s^2R_2C_pC_2+sC_p+s(g_{m9}R_2+1)+g_{m9})] \quad \text{[Equation 4]},$$

where, $\omega_{ps}=1/R_2C_2$, and $C_p=C_{gs9}+C_{db9}+C_{gs3"}$.

With, $g_{m9}R_2 \gg 1$, Equation 4 may be simplified to, $$A_{CM}(s) \approx [kA_0(1/k+s/\omega_{ps})]/[(1+s/\omega_d)(1+s/\omega_L)(1+s/\omega_f)(1+s/\omega_{pf})(1+s/\omega_{ps})]=A_0/[(1+s/\omega_d)(1+s/\omega_L)(1+s/\omega_f)*(k/(1+s/\omega_{pf}))+(1-k)/((1+s/\omega_{pf})(1+s/\omega_{pf}))] \quad \text{[Equation 5]},$$

where, $\omega_{pf}=g_{m9}/C_p$.

Using the multi-path approach of the invention, the overall transfer function of Equation 4 has an additional pole and zero at low frequencies. Since both the pole and zero are at low frequencies compared to the loop bandwidth, the overall response at high frequencies is due solely to the fast path. The loop bandwidth may be described by the expression, $$A_{1gm3"}/C_C=A_{1kgm3}/C_C, \quad \text{[Equation 6]}.$$

The effect of having a pole-zero doublet at low frequency compared to the loop bandwidth is that the magnitude of the slow-settling component is small. This is preferably achieved by the selection of the values of the components of the low pass filter, e.g., R2C2. As the pole-zero doublet spacing increases, the magnitude of the slow-settling component increases. Using the invention, the zero appears at 1/k times the pole frequency, Therefore, in implementing the invention it is preferred that k should not be too small. For most applications, a k value greater than approximately 0.2 is preferable. An advantageous aspect of the invention is the fact that noise due to the R2 in the RC filter appears as CM noise. Only a very small fraction (<1%) of this noise appears as differential noise as long as the matching between the positive and the negative branches of the amplifier is reasonable. An additional aspect of using the multi-path methods and systems of the invention is the increase in the DC transconductance gain and hence the DC accuracy of the CM loop, which may be particularly advantageous in some applications. This is a direct consequence of controlling a larger fraction of bias currents by the CMFB loop.

The methods and systems of the invention provide one or more advantages which may include reduction or avoidance of latching. While the invention has been described with reference to certain illustrative embodiments, those described herein are not intended to be construed in a limiting sense. For example, variations or combinations of steps in the embodiments shown and described may be used in particular cases without departure from the invention. For example, although the examples shown and discussed illustrate a two-stage amplifier system, the invention may also be used with any multi-stage amplifier system having an even number of gain stages. Additionally, although a class A amplifier is shown, the invention may be practiced with other classes of amplifier, such as class AB amplifiers. In another example of alternative embodiments, those skilled in the arts will recognize that the invention may be applied equally in systems using PMOS or NMOS input stages. Modifications and combinations of the illustrative embodiments as well as other advantages and embodiments of the invention will be apparent to persons skilled in the arts upon reference to the drawings, description, and claims.

We claim:

1. A system for common mode feedback in a fully differentiated multi-stage amplifier system, comprising:
   a multi-path common mode feedback loop configured for narrow bandwidth and large bias current;
   wherein the multi-path common mode feedback loop comprises a slow path having a low pass filter configured to ensure that the slow path is inactive at approximately the unity gain bandwidth of the system.

2. A system for common mode feedback in a fully differentiated multi-stage amplifier system, comprising:
   a multi-path common mode feedback loop configured for narrow bandwidth and large bias current;
   wherein the multi-path common mode feedback loop comprises a slow path having a low pass filter.

3. A system according to claim 2 wherein the multi-path common mode feedback loop comprises a fast path.

4. A system for common mode feedback in a fully differentiated multi-stage amplifier system, comprising:
   a multi-path common mode feedback loop configured for narrow bandwidth and large bias current;
   wherein the bandwidth of the multi-path common mode feedback loop is described by the ratio of the transconductance gain of a fast path and the compensating capacitance of the fully differentiated multi-stage amplifier system.

5. A multi-path common mode feedback system for a high speed multi-stage amplifier, comprising:
   a slow path further comprising a series RC low pass filter operably coupled to a slow path transistor; and
   a fast path further comprising a fast path transistor;
   wherein the slow path and fast path are configured for controlling a common mode feedback current within a small bandwidth.

6. A system according to claim 5 wherein the fast path is configured for controlling common mode loop bandwidth.

7. A system according to claim 5 wherein the slow path and fast path are configured in combination for controlling DC performance.

8. A system according to claim 5 wherein the bandwidth of the multi-path common mode feedback loop is described by the ratio of the transconductance gain of the fast path and the compensating capacitance of the high speed multi-stage amplifier.

9. A method for controlling a common mode feedback loop for a multi-stage amplifier system, comprising the steps of:
   dividing the common mode feedback current path; thereby providing a slow common mode feedback current; and
   providing a fast common mode feedback current path;
   wherein the slow path and fast path are configured for controlling a common mode feedback current within a narrow bandwidth; and
   wherein the bandwidth of the multi-path common mode feedback loop is described by the ratio of the transconductance gain of the fast path and the compensating capacitance of the multi-stage amplifier system.

10. A method for controlling a common mode feedback loop for a multi-stage amplifier system, comprising the steps of:
    dividing the common mode feedback current path; thereby providing a slow common mode feedback current; and
    providing a fast common mode feedback current path;
    wherein the slow path and fast path are configured for controlling a common mode feedback current within a narrow bandwidth; and
    further comprising the step of configuring the fast path for controlling system bandwidth.

11. A method for controlling a common mode feedback loop for a multi-stage amplifier system, comprising the steps of:
    dividing the common mode feedback current path; thereby providing a slow common mode feedback current; and
    providing a fast common mode feedback current path;
    wherein the slow path and fast path are configured for controlling a common mode feedback current within a narrow bandwidth; and
    further comprising the step of configuring the slow path and fast path in a combination for controlling DC performance of the system.

12. A method for controlling a common mode feedback loop for a multi-stage amplifier system, comprising the steps of:
    dividing the common mode feedback current path; thereby providing a slow common mode feedback current; and
    providing a fast common mode feedback current path;

wherein the slow path and fast path are configured for controlling a common mode feedback current within a narrow bandwidth; and further comprising the step of configuring the slow path for inactivation in response to the condition of approaching unity gain bandwidth.

13. A multi-path common mode feedback system comprising:

a fast path having a fast path transistor, the fast path configured for determining the bandwidth of the common mode feedback loop; and a slow path having a slow path transistor operably coupled to a low pass filter, the low pass filter having a 3 dB bandwidth of about one-tenth of the fast path bandwidth;

wherein the slow path and fast path are configured to operate in combination to determine the direct current carrying capacity of the common mode loop, and wherein the bandwidth of the loop is determined by how the current is divided between the fast path and the slow path.

* * * * *